(12) United States Patent
Lee et al.

(10) Patent No.: US 10,637,638 B2
(45) Date of Patent: Apr. 28, 2020

(54) SEMICONDUCTOR APPARATUS FOR TRANSMITTING AND RECEIVING A SIGNAL IN SYNCHRONIZATION WITH A CLOCK SIGNAL

(71) Applicant: SK hynix Inc., Icheon-si, Gyeonggi-do (KR)

(72) Inventors: Seung Hun Lee, Icheon-si (KR); Sang Sic Yoon, Icheon-si (KR); Soo Young Jang, Seoul (KR); Jin Youp Cha, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/142,960

(22) Filed: Sep. 26, 2018

(65) Prior Publication Data

US 2019/0296887 A1 Sep. 26, 2019

(30) Foreign Application Priority Data

Mar. 21, 2018 (KR) .......................... 10-2018-0032540

(51) Int. Cl.
| | |
|---|---|
| *H04L 7/06* | (2006.01) |
| *H04L 7/00* | (2006.01) |
| *H03K 5/14* | (2014.01) |
| *H03K 5/135* | (2006.01) |
| *G06F 1/12* | (2006.01) |
| *H03K 5/00* | (2006.01) |

(52) U.S. Cl.
CPC .............. *H04L 7/0037* (2013.01); *G06F 1/12* (2013.01); *H03K 5/135* (2013.01); *H03K 5/14* (2013.01); *H04L 7/0079* (2013.01); *H03K 2005/00019* (2013.01); *H03K 2005/00234* (2013.01)

(58) Field of Classification Search
CPC ....... H04L 7/0037; H04L 7/0079; H03K 5/14; H03K 5/135; H03K 2005/00019; H03K 2005/00234; G06F 1/12
See application file for complete search history.

(56) References Cited

U.S. PATENT DOCUMENTS

| | | | |
|---|---|---|---|
| 8,819,354 B2 | 8/2014 | Seto et al. | |
| 9,094,238 B2 | 7/2015 | Zerbe et al. | |
| 2006/0109895 A1* | 5/2006 | Watanabe | G01R 31/31922 375/224 |
| 2009/0085616 A1* | 4/2009 | Wada | H03K 5/135 327/117 |
| 2009/0147903 A1* | 6/2009 | Kikuchi | H03L 7/07 375/376 |
| 2016/0006559 A1* | 1/2016 | Arai | H03L 7/183 375/376 |
| 2016/0254805 A1* | 9/2016 | Choi | H03K 5/135 327/108 |

* cited by examiner

*Primary Examiner* — Dac V Ha
(74) *Attorney, Agent, or Firm* — William Park & Associates Ltd.

(57) ABSTRACT

A semiconductor apparatus includes a transmission device and a receiving device. The transmission device generates an output signal from a transmission signal in synchronization with a clock signal. The receiving device generates a reception signal from the output signal in synchronization with the clock signal and a delayed clock signal generated by delaying the clock signal by a preset time, based on an operating speed of the semiconductor apparatus.

19 Claims, 5 Drawing Sheets

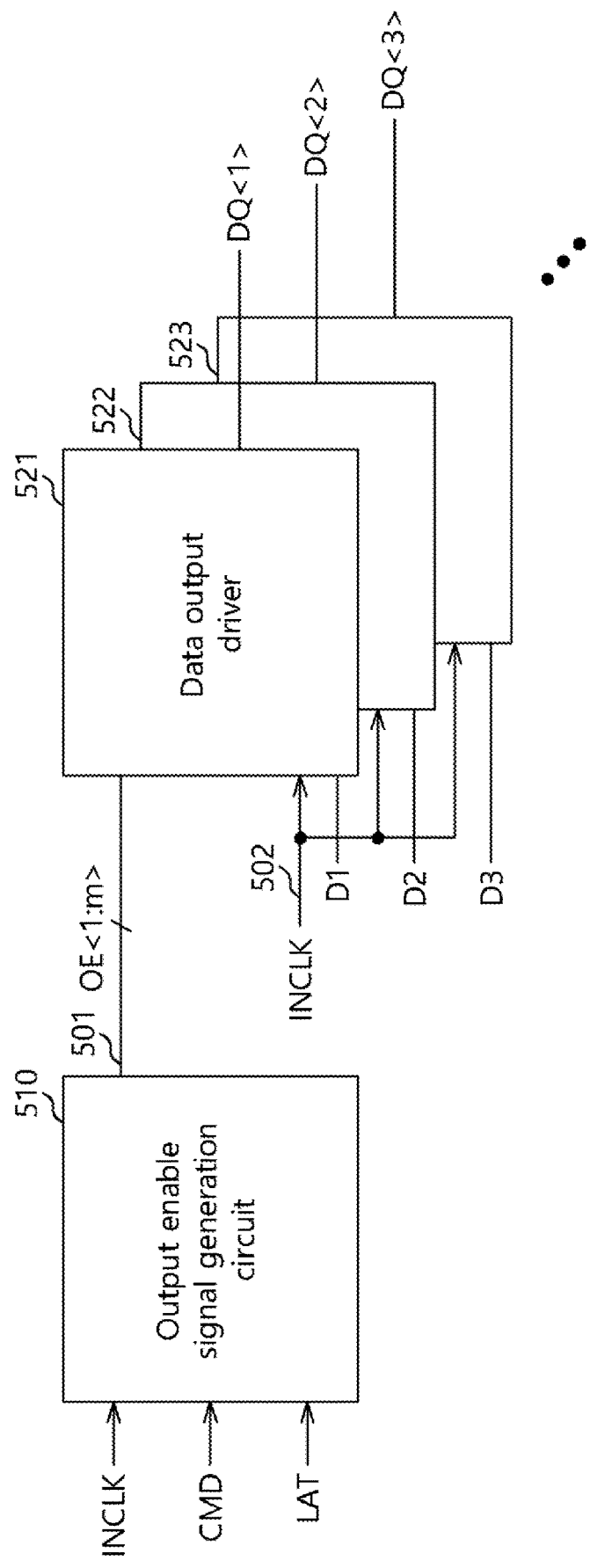

SEMICONDUCTOR APPARATUS FOR TRANSMITTING AND RECEIVING A SIGNAL IN SYNCHRONIZATION WITH A CLOCK SIGNAL

CROSS-REFERENCES TO RELATED APPLICATION

The present application claims priority under 35 U.S.C. § 119(a) to Korean application number 10-2018-0032540, filed on Mar. 21, 2018, in the Korean Intellectual Property Office, which is incorporated herein by reference in its entirety.

BACKGROUND

1. Technical Field

Various embodiments generally relate to an integrated circuit technology and, more particularly, to signal transmission and reception for a semiconductor apparatus.

2. Related Art

Each electronic apparatus may include a large number of electronic components. For example, a computer system may include a large number of semiconductor apparatuses which are constructed by semiconductors. Semiconductor apparatuses which construct the computer system may operate in synchronization with a clock signal. Not only between the internal circuits of a semiconductor apparatus, but also between one semiconductor apparatus and another semiconductor apparatus, various synchronized signals may be transmitted and received in synchronization with a clock signal. As the operating speed of the computer system increases, the operating speed of the semiconductor apparatuses is increasing as well. For example, the frequency of a clock signal is increasing such that the semiconductor apparatuses may operate at a high speed.

As the frequency of the clock signal increases, the time margin required for a synchronized signal synchronized with the clock signal to be transmitted and received is gradually decreasing. A transmission device which transmits the synchronized signal and a receiving device which receives the synchronized signal may be coupled through a signal transmission line. The difference between a delay time induced in the signal transmission line through which the synchronized signal is transmitted and a delay time induced in a signal transmission line through which the clock signal is transmitted may further decrease such a time margin.

SUMMARY

In an embodiment, a semiconductor apparatus may include a transmission device configured to output a transmission signal as an output signal in synchronization with a clock signal, and output the output signal at one of a first time and a second time, the second time being earlier than the first point of time, based on an operation information signal; and a receiving device configured to receive the output signal and the clock signal and generate a reception signal by delaying the output signal by a time corresponding to one of a third time and a fourth time, the fourth time being longer than the third time, based on the operation information signal.

In an embodiment, a semiconductor apparatus may include a transmission device configured to generate an output signal from a transmission signal in synchronization with a clock signal; and a receiving device configured to receive the output signal and the clock signal, and generate a reception signal from the output signal in synchronization with the clock signal and a delayed clock signal which is generated by delaying the clock signal by a preset time.

In an embodiment, a semiconductor apparatus may include a transmission device configured to transmit an output signal in correspondence to a clock signal, transmit the output signal at a first time when the semiconductor apparatus operates with a low frequency, and transmit the output signal at a second time, the second time being earlier than the first point of time, when the semiconductor apparatus operates with a high frequency, the high frequency being higher than the low frequency; and a receiving device configured to receive the clock signal and the output signal, generate a reception signal by synchronizing the output signal with the clock signal when the semiconductor apparatus operates with a low frequency, and generate the reception signal by synchronizing the output signal with a delayed clock signal generated, by delaying the clock signal by a preset time, when the semiconductor apparatus operates with a high frequency.

In an embodiment, a semiconductor system may include a first semiconductor circuit configured to generate an output signal in synchronization with a clock signal; and a second semiconductor circuit configured to receive the output signal and the clock signal, and generate a reception signal from the output signal in synchronization with a delayed clock signal which is generated by delaying the clock signal by a preset time.

BRIEF DESCRIPTION OF THE DRAWINGS

FIG. 5 is a diagram illustrating a representation of an example of the configuration of a semiconductor apparatus in accordance with an embodiment.

DETAILED DESCRIPTION

Hereinafter, a semiconductor apparatus for transmitting and receiving a signal in synchronization with a clock signal will be described below with reference to the accompanying drawings through various examples of embodiments.

Figure 1:
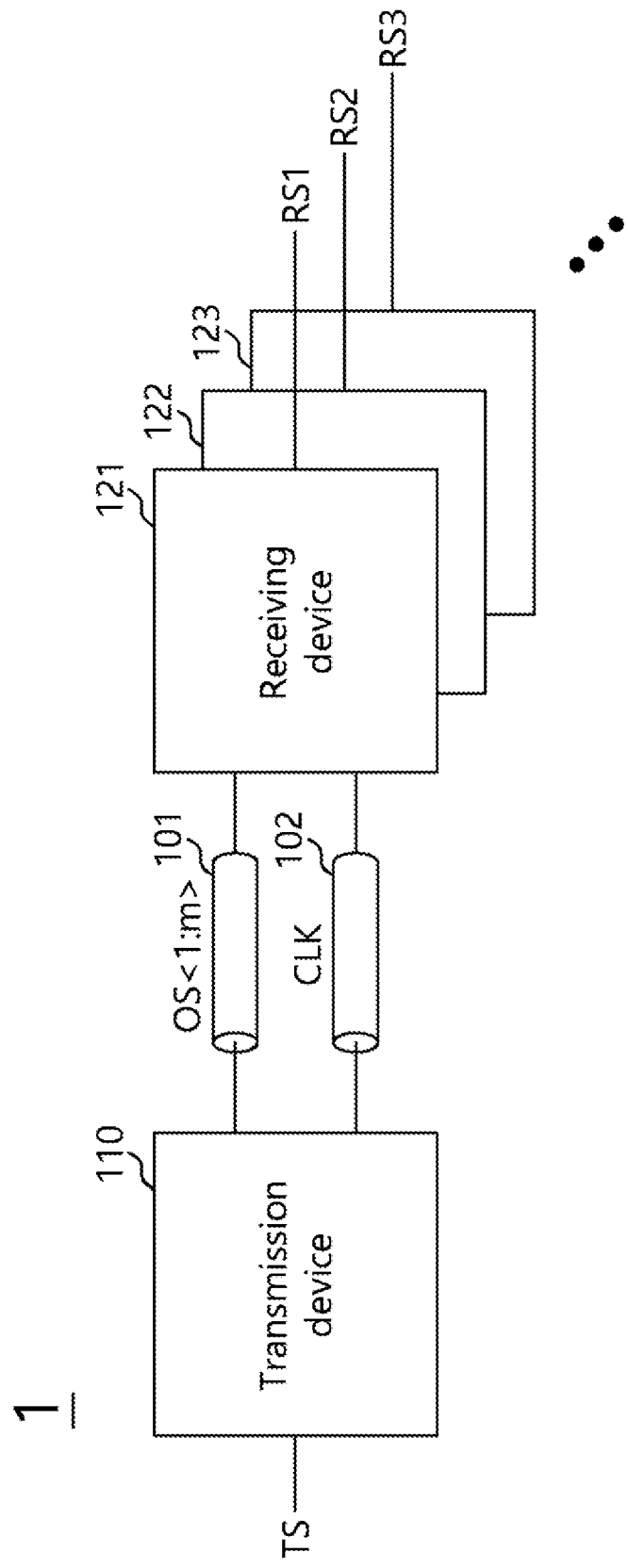
FIG. 1 is a diagram illustrating a representation of an example of the configuration of a semiconductor apparatus in accordance with an embodiment.

FIG. 1 is a diagram illustrating a representation of an example of the configuration of a semiconductor apparatus 1 in accordance with an embodiment. In FIG. 1, the semiconductor apparatus 1 may include a transmission device 110 and receiving devices 121, 122 and 123. The transmission device 110 may generate output signals OS<1:m> (m is an integer of 3 or more) by synchronizing a transmission signal TS with a clock signal CLK, and may transmit the output signals OS<1:m> to the receiving devices 121, 122 and 123. The transmission device 110 may be coupled with the receiving devices 121, 122 and 123 through a first signal transmission line 101, and the output signals OS<1:m> may be transmitted to the receiving devices 121, 122 and 123 through the first signal transmission line 101. The transmission device 110 may transmit the clock signal CLK to the receiving devices 121, 122 and 123. The transmission device 110 may be coupled with the receiving devices 121, 122 and 123 through a second signal transmission line 102, and the clock signal CLK may be transmitted through the second signal transmission line 102. The receiving devices 121, 122 and 123 may receive the output signals OS<1:m> and the clock signal CLK. The receiving devices 121, 122 and 123 may receive the output signals OS<1:m> through the first signal transmission line 101 and receive the clock signal CLK through the second transmission line 102. The receiving devices 121, 122 and 123 may generate reception signals RS1, RS2 and RS3 from the output signals OS<1:m> in synchronization with the clock signal CLK.

The transmission device 110 may adjust a point of time at which the output signals OS<1:m> are transmitted, based on the operating speed of the semiconductor apparatus 1. The receiving devices 121, 122 and 123 may adjust a point of time at which the reception signals RS1, RS2 and RS3 are generated from the output signals OS<1:m>, based on the operating speed of the semiconductor apparatus 1. The semiconductor apparatus 1 may operate at a high speed with a high frequency and may operate at a low speed with a low frequency, the low frequency being lower than the high frequency. The transmission device 110 may transmit the output signals OS<1:m> to the receiving devices 121, 122 and 123 at a first point of time when the semiconductor apparatus 1 operates with the low frequency. The transmission device 110 may transmit the output signals OS<1:m> to the receiving devices 121, 122 and 123 at a second point of time, the second point of time being earlier than the first point of time, when the semiconductor apparatus 1 operates with the high frequency. The time difference between the second point of time and the first point of time may be n times one cycle of the clock signal CLK. Here, n may be an integer of 1 or more. For example, the time difference between the second point of time and the first point of time may be a time corresponding to two cycles of the clock signal CLK. When the semiconductor apparatus 1 operates with the low frequency, the receiving devices 121, 122 and 123 may generate the reception signals RS1, RS2 and RS3 by delaying the output signals OS<1:m> by a time corresponding to a first time. When the semiconductor apparatus 1 operates with the high frequency, the receiving devices 121, 122 and 123 may generate the reception signals RS1, RS2 and RS3 by delaying the output signals OS<1:m> by a time corresponding to a second time, the second time being longer than the first time. The time difference between the second time and the first time may be the time difference between the second point of time and the first point of time minus a preset time. Descriptions will be made later for the preset time.

The word "preset" as used herein with respect to a parameter, such as a preset time, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

For example, the output signals OS<1:m> may be a plurality of pulse signals which are enabled at different timings. Each of the receiving devices 121, 122 and 123 may receive an output signal allocated thereto among the output signals OS<1:m>. The receiving devices 121, 122 and 123 may receive the output signals OS<1:m> respectively allocated thereto and generate the reception signals RS1, RS2 and RS3, respectively, in synchronization with the clock signal CLK. In an embodiment, the transmission device 110 and the receiving devices 121, 122 and 123 may be internal circuits which are disposed in one semiconductor apparatus, and the first and second signal transmission lines 101 and 102 may be internal signal buses. In another embodiment, the transmission device 110 may be an internal circuit of a first semiconductor apparatus, and the receiving devices 121, 122 and 123 may be internal circuits of a second semiconductor apparatus. The first and second signal transmission lines 101 and 102 may be external signal buses.

Figure 2:
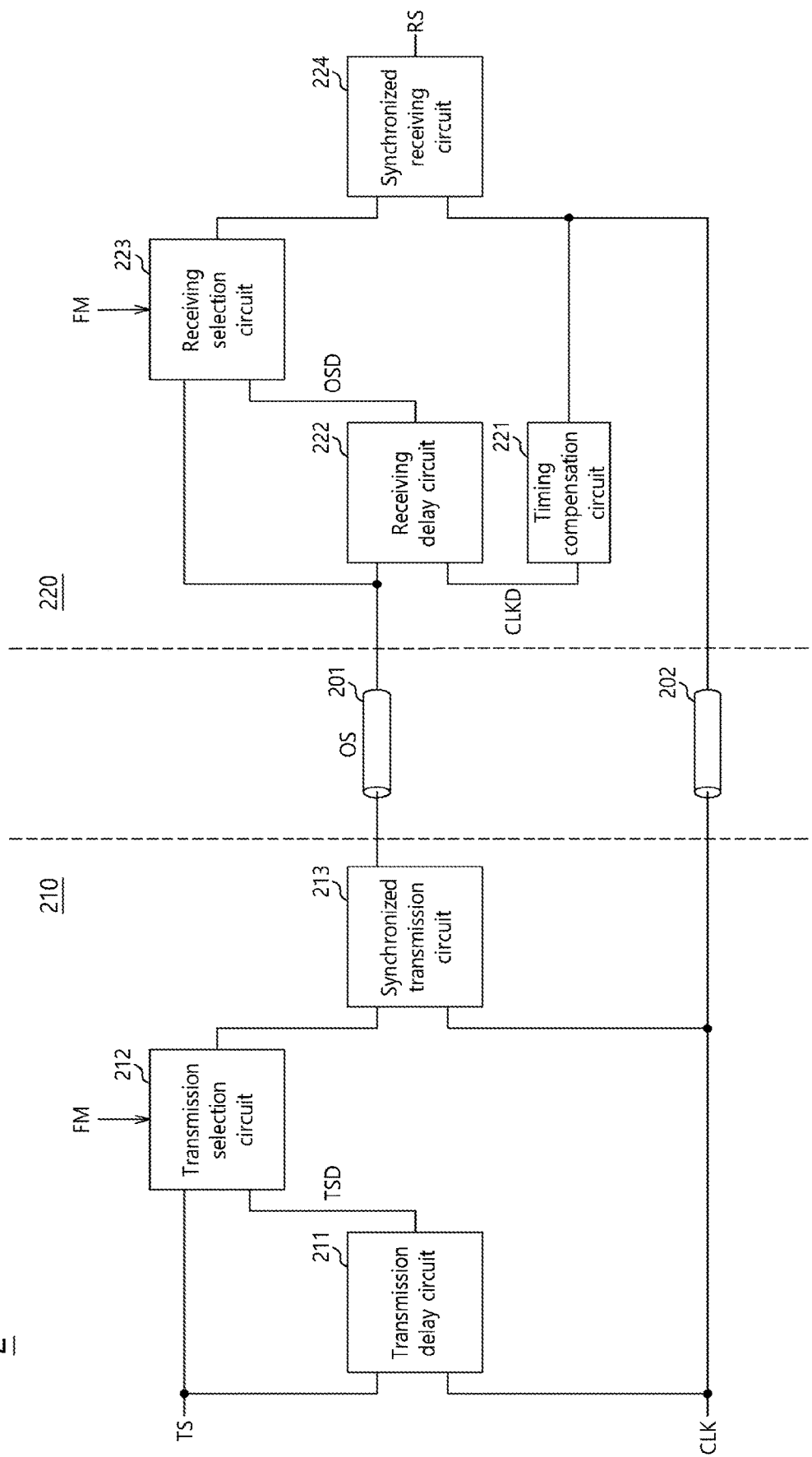
FIG. 2 is a block diagram illustrating a representation of an example of the configuration of a semiconductor apparatus in accordance with an embodiment.

FIG. 2 is a block diagram illustrating a representation of an example of the configuration of a semiconductor apparatus 2 in accordance with an embodiment. In FIG. 2, the semiconductor apparatus 2 may include a transmission device 210 and a receiving device 220. The transmission device 210 may be applied as the transmission device 110 shown in FIG. 1, and the receiving device 220 may be applied as one of the receiving devices 121, 122 and 123 shown in FIG. 1. In FIG. 2, the transmission device 210 may receive a transmission signal TS and a clock signal CLK and output an output signal OS. The transmission device 210 may generate the output signal OS from the transmission signal TS in synchronization with the clock signal CLK. The transmission device 210 may adjust a point of time at which the output signal OS is generated and/or transmitted, based on an operation information signal FM. The operation information signal FM may include an information which is associated with the operating speed of the semiconductor apparatus 2. The operation information signal FM may include an information on whether the semiconductor apparatus 2 operates at a high speed or a low speed. For example, the operation information signal FM may be enabled when the semiconductor apparatus 2 operates with a high frequency, and may be disabled when the semiconductor apparatus 2 operates with a low frequency, the low frequency being lower than the high frequency. The transmission device 210 may generate and/or transmit the output signal OS at a first point of time when the semiconductor apparatus 2 operates with the low frequency, and may generate and/or transmit the output signal OS at a second point of time when the semiconductor apparatus 2 operates with the high frequency. The second point of time may be a point of time earlier than the first point of time. The time difference between the second point of time and the first point of time may be a time corresponding to n times one cycle of the clock signal CLK.

The receiving device 220 may receive the output signal OS and the clock signal CLK which are transmitted from the transmission device 210. The receiving device 220 may generate a reception signal RS based on the output signal OS and the clock signal CLK. The receiving device 220 may adjust a point of time at which the reception signal RS is generated, based on the operation information signal FM. The receiving device 220 may generate the reception signal RS by delaying the output signal OS by a first time when the semiconductor apparatus 2 operates at a low speed. The receiving device 220 may generate the reception signal RS by delaying the output signal OS by a second time when the semiconductor apparatus 2 operates at a high speed. The second time may be longer than the first time.

The transmission device 210 and the receiving device 220 may be coupled with each other through a first signal transmission line 201 and a second signal transmission line 202. The output signal OS generated from the transmission device 210 may be transmitted through the first signal transmission line 201. The clock signal CLK may be transmitted through the second signal transmission line 202. The loading of the first signal transmission line 201 and/or a delay time induced in the first signal transmission line 201 may be different from the loading of the second signal transmission line 202 and/or a delay time induced in the second signal transmission line 202. The first signal transmission line 201 and the second signal transmission line 202 may have a physical loading difference. Also, since the characteristics of the signals transmitted through the first and second signal transmission lines 201 and 202 are different from each other, a mismatch or an offset between the first and second signal transmission lines 201 and 202 may occur. In particular, as the semiconductor apparatus 2 operates with a high frequency, the amplitudes and pulse widths of the output signal OS and the clock signal CLK may decrease, and a time margin for the receiving device 220 to receive the output signal OS and generate the reception signal RS may become insufficient due to the mismatch or the offset. Therefore, when the semiconductor apparatus 2 operates with a high frequency, the transmission device 210 may transmit the output signal OS at the second point of time earlier than the first point of time, and the receiving device 220 may generate the reception signal RS by delaying the output signal OS. The receiving device 220 may generate the reception signal RS by compensating for the mismatch or the offset between the first and second signal transmission lines 201 and 202. For example, the time difference between the second time and the first time may be shorter than the time difference between the first point of time and the second point of time. The difference therebetween may be a preset time. The preset time may be equal to or longer than the difference between a delay time induced in the first signal transmission line 201 and a delay time induced in the second signal transmission line 202 due to the mismatch or the offset between the first and second signal transmission lines 201 and 202.

Depending on the operating speed of the semiconductor apparatus 2, the receiving device 220 may generate the reception signal RS from the output signal OS in synchronization with the clock signal CLK and may generate the reception signal RS from the output signal OS in synchronization with a delayed clock signal CLKD which is generated by delaying the clock signal CLK by the preset time. The receiving device 220 may generate the reception signal RS from the output signal OS in synchronization with the clock signal CLK when the semiconductor apparatus 2 operates with a low frequency. The receiving device 220 may generate the reception signal RS from the output signal OS in synchronization with the delayed clock signal CLKD and the clock signal CLK when the semiconductor apparatus 2 operates with a high frequency. The receiving device 220 may compensate for a mismatch or an offset likely to occur between the first and second signal transmission lines 201 and 202, by synchronizing the output signal OS with the delayed clock signal CLKD. Therefore, the output signal OS and the clock signal CLK may be transmitted with sufficient time margins through the first and second signal transmission lines 201 and 202, respectively.

In FIG. 2, the transmission device 210 may include a transmission delay circuit 211, a transmission selection circuit 212 and a synchronized transmission circuit 213. The transmission delay circuit 211 may receive the transmission signal TS and the clock signal CLK and generate a delayed transmission signal TSD. The transmission delay circuit 211 may generate the delayed transmission signal TSD by delaying the transmission signal TS by a time corresponding to n times one cycle of the clock signal CLK. For example, the transmission delay circuit 211 may generate the delayed transmission signal TSD by delaying the transmission signal TS by a time corresponding to two cycles of the clock signal CLK. The transmission delay circuit 211 may induce the time difference between the first point of time and the second point of time, and the delay amount of the transmission delay circuit 211 may correspond to the time difference between the first point of time and the second point of time. The transmission selection circuit 212 may receive the transmission signal TS, the delayed transmission signal TSD and the operation information signal FM. The transmission selection circuit 212 may output one of the transmission signal TS and the delayed transmission signal TSD based on the operation information signal FM. For example, the transmission selection circuit 212 may select and output the delayed transmission signal TSD when the operation information signal FM is disabled, and may select and output the transmission signal TS when the operation information signal FM is enabled. The synchronized transmission circuit 213 may receive the output of the transmission selection circuit 212 and the clock signal CLK. The synchronized transmission circuit 213 may generate the output signal OS from the output of the transmission selection circuit 212 in synchronization with the clock signal CLK.

In FIG. 2, the receiving device 220 may include a timing compensation circuit 221, a receiving delay circuit 222, a receiving selection circuit 223 and a synchronized receiving circuit 224. The timing compensation circuit 221 may receive the clock signal CLK, and may generate the delayed clock signal CLKD by delaying the clock signal CLK by a preset delay time. The receiving delay circuit 222 may receive the output signal OS and the delayed clock signal CLKD. The receiving delay circuit 222 may generate a delayed output signal OSD from the output signal OS in synchronization with the delayed clock signal CLKD. The receiving delay circuit 222 may induce the time difference between the first time and the second time. The delay amount of the receiving delay circuit 222 may correspond to a time that is obtained by subtracting the preset time from a time corresponding to the delay amount of the transmission delay circuit 211. The receiving selection circuit 223 may receive the output signal OS, the delayed output signal OSD and the operation information signal FM. The receiving selection circuit 223 may output one of the output signal OS and the delayed output signal OSD based on the operation information signal FM. For example, the receiving selection circuit 223 may select and output the output signal OS when the operation information signal FM is disabled, and may select and output the delayed output signal OSD when the operation information signal FM is enabled. The synchronized receiving circuit 224 may receive the output of the receiving selection circuit 223 and the clock signal CLK. The synchronized receiving circuit 224 may generate the reception signal RS from the output of the receiving selection circuit 223 in synchronization with the clock signal CLK.

Figure 3:
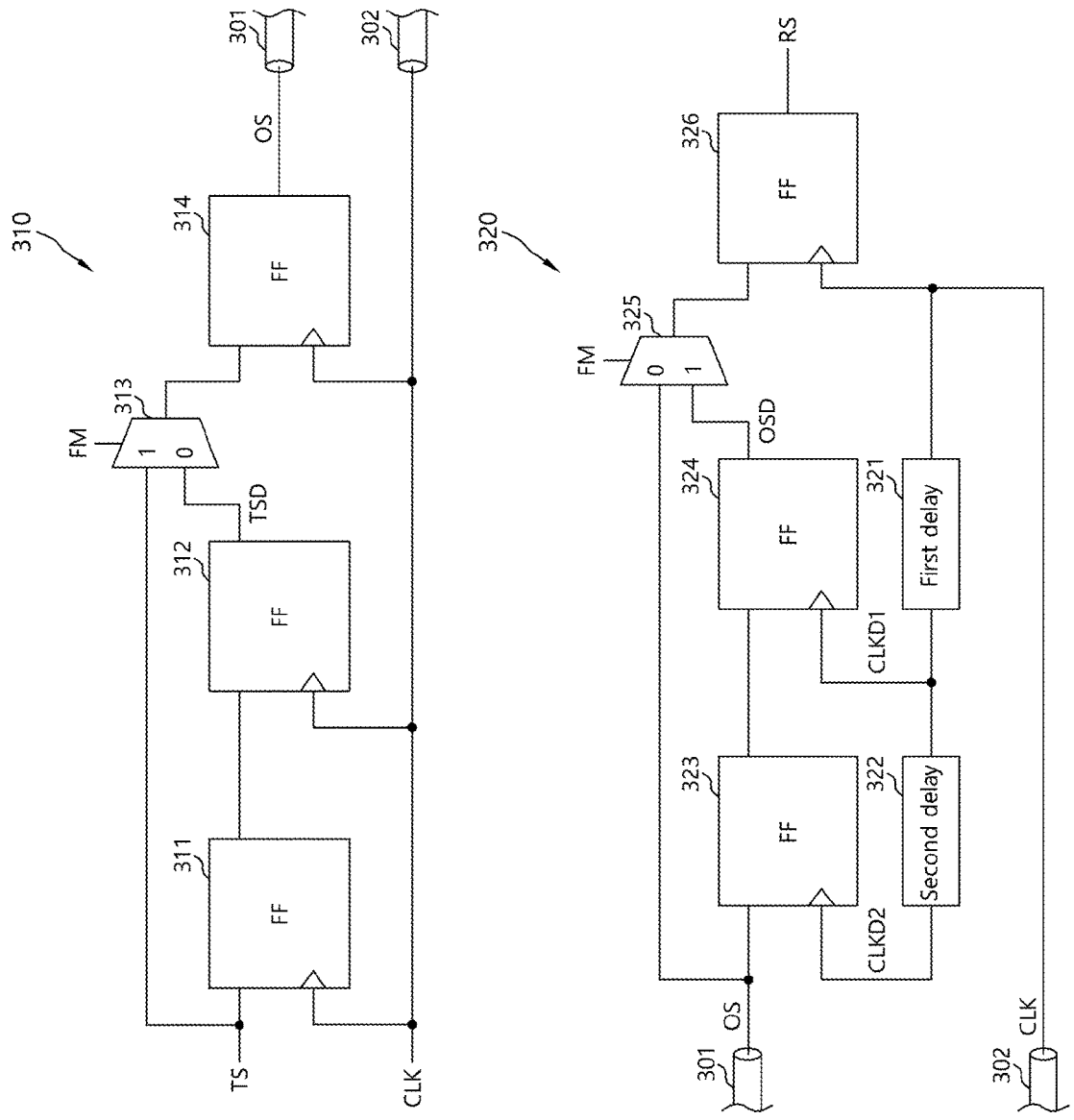
FIG. 3 is a diagram illustrating a representation of an example of the configuration of a semiconductor apparatus in accordance with an embodiment.

FIG. 3 is a diagram illustrating a representation of an example of the configuration of a semiconductor apparatus 3 in accordance with an embodiment. In FIG. 3, the semiconductor apparatus 3 may include a transmission device 310 and a receiving device 320. The transmission device 310 may be an embodiment of the transmission device 210 shown in FIG. 2, and the receiving device 320 may be an embodiment of the receiving device 220 shown in FIG. 2. In FIG. 3, the transmission device 310 may include a first flip-flop 311, a second flip-flop 312, a multiplexer 313 and a third flip-flop 314. The first and second flip-flops 311 and 312 may be components corresponding to the transmission delay circuit 211. The multiplexer 313 may be a component corresponding to the transmission selection circuit 212. The third flip-flop 314 may be a component corresponding to the synchronized transmission circuit 213. The first flip-flop 311 may receive the clock signal CLK through a clock terminal and receive the transmission signal TS through an input terminal. The first flip-flop 311 may output the transmission signal TS by synchronizing it with the clock signal CLK. For example, the first flip-flop 311 may output the transmission signal TS in synchronization with the rising edge of the clock signal CLK. The second flip-flop 312 may receive the clock signal CLK through a clock terminal and receive the output of the first flip-flop 311 through an input terminal. The second flip-flop 312 may output the output of the first flip-flop 311 by synchronizing it with the clock signal CLK. For example, the second flip-flop 312 may output the delayed transmission signal TSD in synchronization with the rising edge of the clock signal CLK. The multiplexer 313 may select and output one of the transmission signal TS and the delayed transmission signal TSD based on the operation information signal FM. For example, the multiplexer 313 may output the delayed transmission signal TSD when the operation information signal FM is disabled, and may output the transmission signal TS when the operation information signal FM is enabled. The third flip-flop 314 may receive the clock signal CLK through a clock terminal and receive the output of the multiplexer 313 through an input terminal. The third flip-flop 314 may output the output of the multiplexer 313 as the output signal OS by synchronizing it with the clock signal CLK. For example, the third flip-flop 314 may generate the output signal OS from the output of the multiplexer 313 in synchronization with the rising edge of the clock signal CLK.

In FIG. 3, the receiving device 320 may include a first delay 321, a second delay 322, a first flip-flop 323, a second flip-flop 324, a multiplexer 325 and a third flip-flop 326. The first and second delays 321 and 322 may be components corresponding to the timing compensation circuit 221. The first and second flip-flops 323 and 324 may be components corresponding to the receiving delay circuit 222. The multiplexer 325 may be a component corresponding to the receiving selection circuit 223. The third flip-flop 326 may be a component corresponding to the synchronized receiving circuit 224. The first delay 321 may receive the clock signal CLK. The first delay 321 may delay the clock signal CLK and generate a first delayed clock signal CLKD1. The second delay 322 may receive the first delayed clock signal CLKD1. The second delay 322 may delay the first delayed clock signal CLKD1 and generate a second delayed clock signal CLKD2. The second delayed clock signal CLKD2 may correspond to the delayed clock signal CLKD shown in FIG. 2. The delay amount of the first delay 321 and the delay amount of the second delay 322 may be the same with or different from each other. A time corresponding to the sum of the delay amounts of the first delay 321 and the second delay 322 may be substantially the same as the preset time.

The first flip-flop 323 may receive the second delayed clock signal CLKD2 through a clock terminal and receive the output signal OS through an input terminal. The first flip-flop 323 may output the output signal OS by synchronizing it with the second delayed clock signal CLKD2. For example, the first flip-flop 323 may output the output signal OS in synchronization with the rising edge of the second delayed clock signal CLKD2. The second flip-flop 324 may receive the first delayed clock signal CLKD1 through a clock terminal and receive the output of the first flip-flop 323 through an input terminal. The second flip-flop 324 may output the output of the first flip-flop 323 by synchronizing it with the first delayed clock signal CLKD1. For example, the second flip-flop 324 may output the delayed output signal OSD in synchronization with the rising edge of the first delayed clock signal CLKD1. The multiplexer 325 may select and output one of the output signal OS and the delayed output signal OSD based on the operation information signal FM. For example, the multiplexer 325 may output the output signal OS when the operation information signal FM is disabled, and may output the delayed output signal OSD when the operation information signal FM is enabled. The third flip-flop 326 may receive the clock signal CLK through a clock terminal and receive the output of the multiplexer 325 through an input terminal. The third flip-flop 326 may output the output of the multiplexer 325 as the reception signal RS by synchronizing it with the clock signal CLK. For example, the third flip-flop 326 may generate the reception signal RS from the output of the multiplexer 325 in synchronization with the rising edge of the clock signal CLK.

An example of the operation of the semiconductor apparatus 3 in accordance with the embodiment will be described below with reference to FIG. 3. Delay times by the first flip-flop 311 and the second flip-flop 312 may be the same with each other, and each delay time may be one cycle of the clock signal CLK. A delay time by the third flip-flop 314 may be one cycle of the clock signal CLK. It is assumed that a delay time induced by the circuit characteristic of the third flip-flop 314 is tTRANS. It is assumed that a delay time by the first delay 321 is tD1 and a delay time by the second delay 322 is tD2. It is assumed that a delay time by the first flip-flop 323 is tRF1 and a delay time by the second flip-flop 324 is tRF2. A delay time by the third flip-flop 326 may be one cycle of the clock signal CLK. It is assumed that a delay time induced by the circuit characteristic of the third flip-flop 326 is tSETUP. It is assumed that a delay time induced by the mismatch or the offset between first and second signal transmission lines 301 and 302 is tS2C.

When the semiconductor apparatus 3 operates with a low frequency, the operation information signal FM may be disabled. The transmission device 310 may generate the output signal OS at a first point of time. The first and second flip-flops 311 and 312 may respectively output the transmission signal TS by synchronizing it with the clock signal CLK, and the transmission selection circuit 313 may select and output the delayed transmission signal TSD. The third flip-flop 314 may output the delayed transmission signal TSD as the output signal OS by synchronizing it with the clock signal CLK. Therefore, the first point of time may be after a time of 3*tCKmin+tTRANS elapses from a point of time at which the transmission signal TS is inputted to the transmission device 310. tCKmin may be a time corresponding to one cycle of the clock signal CLK. The receiving selection circuit 325 may select and output the output signal OS based on the operation information signal FM, and the third flip-flop 326 may output the output signal OS as the reception signal RS by synchronizing it with the clock signal CLK. Therefore, the first time may be a time corresponding to 1*tCKmin+tSETUP. Thus, a time tA from a point of time at which the transmission signal TS is inputted to the transmission device 310 to a point of time at which the receiving device 320 generates the reception signal RS is as follows.

$$tA=4*tCKmin+tTRANS+tS2C+tSETUP$$

In order for the receiving device 320 to accurately generate the reception signal RS in synchronization with the clock signal CLK from the output signal OS outputted from the transmission device 310 in synchronization with the clock signal CLK, the following condition should be satisfied.

$$tCKmin>tTRANS+tS2C+tSETUP$$

When the semiconductor apparatus 3 operates with a low frequency, tCKmin may be sufficiently long. Therefore, a time margin for the receiving device 320 to receive the output signal OS from the first signal transmission line 301 and generate the reception signal RS may be sufficient. However, when the semiconductor apparatus 3 operates with a high frequency, because tCKmin becomes relatively short, with the exception of tTRANS and tSETUP which are fixed, an operation of compensating for tS2C may be necessary.

When the semiconductor apparatus 3 operates with a high frequency, the operation information signal FM may be enabled. The transmission selection circuit 313 may select and output the transmission signal TS based on the operation information signal FM. The third flip-flop 314 may output the transmission signal TS as the output signal OS by synchronizing it with the clock signal CLK. Therefore, the second point of time may be after a time of 1*tCKmin+tTRANS elapses from a point of time at which the transmission signal TS is inputted to the transmission device 310. The first flip-flop 323 may receive the output signal OS and output the output signal OS by synchronizing it with the second delayed clock signal CLKD2, and the second flip-flop 324 may output the delayed output signal OSD by synchronizing the output of the first flip-flop 323 with the first delayed clock signal CLKD1. The receiving selection circuit 325 may select and output the delayed output signal OSD based on the operation information signal FM, and the third flip-flop 326 may generate the reception signal RS by synchronizing the delayed output signal OSD with the clock signal CLK. Thus, a time tB from a point of time at which the transmission signal TS is inputted to the transmission device 310 to a point of time at which the receiving device 320 generates the reception signal RS is as follows.

$$tB=2*tCKmin+tTRANS+tS2C+tRF1+tRF2+tSETUP$$

Here, tRF1=1*tCKmin−tD2, and tRF2=1*tCKmin−tD1. Therefore, tB may be expressed as follows.

$$tB=4*tCKmin+tTRANS+tS2C-(tD1+tD2)+tSETUP$$

Hence, the following expression may be induced from tA and tB.

$$tCKmin>tTRANS+tS2C(tD1+tD2)+tSETUP$$

As in the above expressions, the transmission device 310 may output the output signal OS at the second point of time earlier than the first point of time, and the receiving device 320 may generate the reception signal RS by delaying the output signal OS by the second time longer than the first time. Since the receiving device 320 compensates for a timing by the preset time, a timing margin with which the output signal OS and the clock signal CLK are transmitted through the first and second signal transmission lines 301 and 302 may be extended by tS2C+tD1+tD2. Therefore, even though tCKmin decreases as the semiconductor apparatus 3 operates with a high frequency, by securing a timing margin by the preset time, the receiving device 320 may accurately receive the output signal OS transmitted through the first signal transmission line 301 and generate the reception signal RS.

Figure 4:
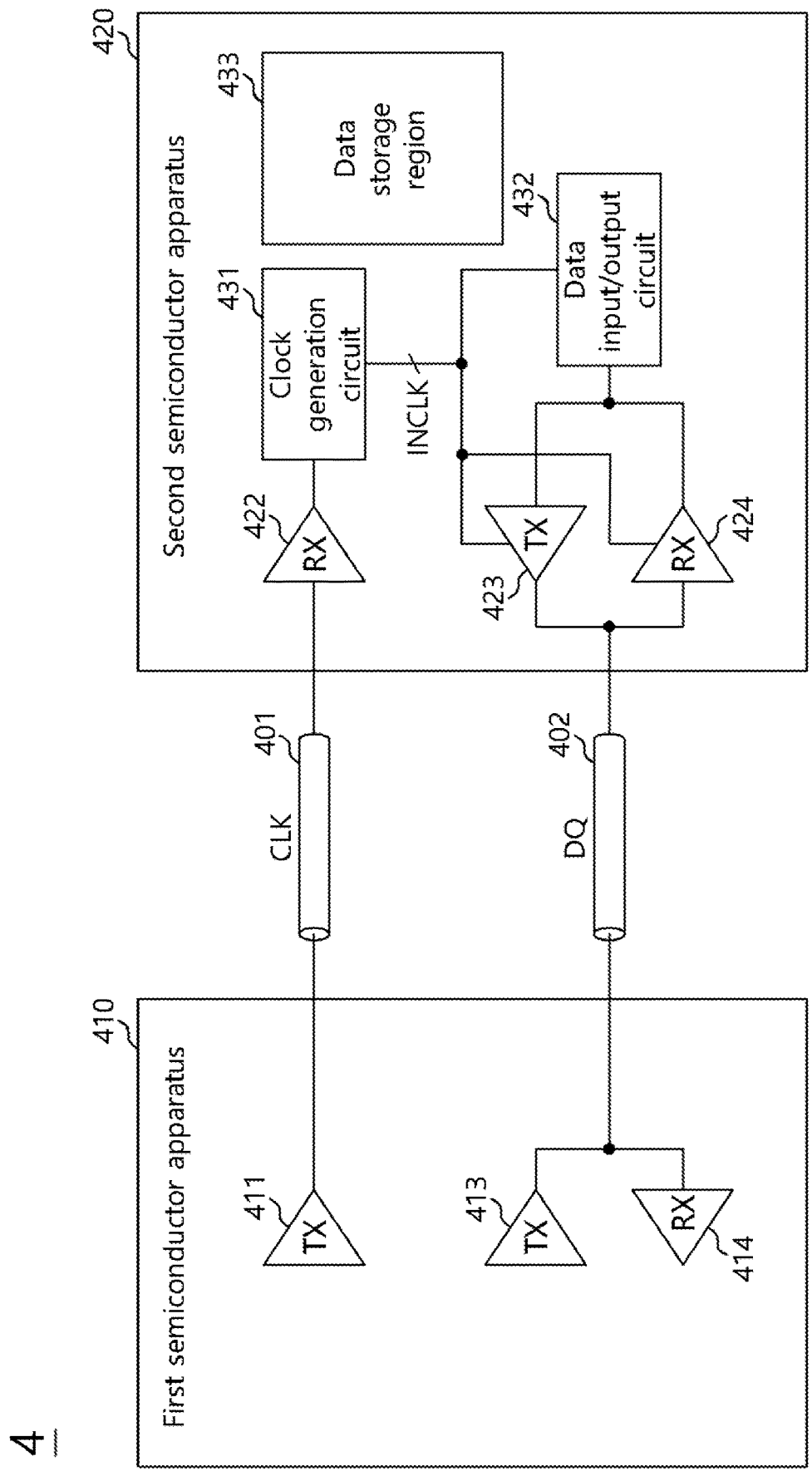
FIG. 4 is a diagram illustrating a representation of an example of the configuration of a semiconductor system in accordance with an embodiment.

FIG. 4 is a diagram illustrating a representation of an example of the configuration of a semiconductor system 4 in accordance with an embodiment. In FIG. 4, the semiconductor system 4 may include a first semiconductor apparatus 410 and a second semiconductor apparatus 420. The first semiconductor apparatus 410 may provide various control signals which are necessary for the second semiconductor apparatus 420 to operate. The first semiconductor apparatus 410 may include various kinds of apparatuses. For example, the first semiconductor apparatus 410 may be a host apparatus such as a central processing unit (CPU), a graphic processing unit (GPU), a multimedia processor (MMP), a digital signal processor, an application processor (AP) or a memory controller. The second semiconductor apparatus 420 may be, for example, a memory apparatus, and the memory apparatus may include a volatile memory or a nonvolatile memory. The volatile memory may include an SRAM (static RAM), a DRAM (dynamic RAM) or an SDRAM (synchronous DRAM), and the nonvolatile memory may include a ROM (read only memory), a PROM (programmable ROM), an EEPROM (electrically erasable and programmable ROM), an EPROM (electrically programmable ROM), a flash memory, a PRAM (phase change RAM), an MRAM (magnetic RAM), an RRAM (resistive RAM) or an FRAM (ferroelectric RAM).

The second semiconductor apparatus 420 may be coupled with the first semiconductor apparatus 410 through a plurality of buses. The plurality of buses may be signal transmission paths, links or channels for transmitting signals. The plurality of buses may include a clock bus 401 and a data bus 402. The clock bus 401 may be a unidirectional bus, and the data bus 402 may be a bidirectional bus. The second semiconductor apparatus 420 may be coupled with the first semiconductor apparatus 410 through the clock bus 401 and receive a clock signal CLK through the clock bus 401. The clock signal CK may include one or more pairs of clock signals. The second semiconductor apparatus 420 may be coupled with the first semiconductor apparatus 410 through the data bus 402, and may receive data DQ from the first semiconductor apparatus 410 or transmit data DQ to the first semiconductor apparatus 410, through the data bus 402. While not shown, the plurality of buses may further include a command address bus. The command address bus may be a unidirectional bus. The second semiconductor apparatus 420 may receive a command address signal from the first semiconductor apparatus 410 through the command address bus.

The first semiconductor apparatus 410 may include a clock transmitter 411, a data transmitter 413 and a data receiver 414. The clock transmitter 411 may provide the clock signal CLK generated in the first semiconductor apparatus 410, to the second semiconductor apparatus 420 through the clock bus 401. The clock transmitter 411 may transmit the clock signal CLK to the second semiconductor apparatus 420 by driving the clock bus 401 based on the clock signal CLK generated from a clock generation circuit (not shown) such as a phase-locked loop. The data transmitter 413 may output the internal data of the first semiconductor apparatus 410 as the data DQ. The data transmitter 413 may provide the data DQ to the second semiconductor apparatus 420 through the data bus 402. The data receiver 414 may receive the data DQ transmitted through the data bus 402 from the second semiconductor apparatus 420.

The second semiconductor apparatus 420 may include a clock receiver 422, a data transmitter 423 and a data receiver 424. The clock receiver 422 may be coupled with the clock bus 401, and may receive the clock signal CLK transmitted through the clock bus 401 from the first semiconductor apparatus 410. The data transmitter 423 may transmit the data DQ from the second semiconductor apparatus 420 to the first semiconductor apparatus 410. The data transmitter 420 may provide the data DQ to the first semiconductor apparatus 410 through the data bus 402. The data receiver 424 may receive the data DQ transmitted through the data bus 402 from the first semiconductor apparatus 410.

The second semiconductor apparatus 420 may include a clock generation circuit 431, a data input/output circuit 432 and a data storage region 433. The clock generation circuit 431 may be coupled with the clock receiver 422, and may generate a plurality of internal clock signals INCLK based on the clock signal CLK received through the clock receiver 422. The second semiconductor apparatus 420 may receive the data DQ transmitted from the first semiconductor apparatus 410 or transmit data DQ to the first semiconductor apparatus 410, in synchronization with the internal clock signals INCLK. The second semiconductor apparatus 420 may receive and/or sample the data DQ transmitted through the data bus 402, with the internal clock signals INCLK.

The data input/output circuit 432 may generate internal data by receiving the data DQ transmitted from the first semiconductor apparatus 410 through the data receiver 424, or may generate data DQ to be transmitted to the first semiconductor apparatus 410 through the data transmitter 423, based on the internal data. The data input/output circuit 432 may receive the plurality of internal clock signals INCLK generated from the clock generation circuit 431. The data input/output circuit 432 may generate the data DQ from the internal data or generate the internal data from the data DQ, in synchronization with the plurality of internal clock signals INCLK. The internal data generated by the data input/output circuit 432 may be stored in the data storage region 433. The internal data stored in the data storage region 433 may be generated as the data DQ by the data input/output circuit 432. The data storage region 433 may be a memory cell array which includes a plurality of memory cells. The data storage region 433 may include a plurality of bit lines and a plurality of word lines, and may include a plurality of memory cells which are coupled to points where the plurality of bit lines and the plurality of word lines intersect with each other. In FIG. 4, the transmission devices 210 and 310 shown in FIGS. 2 and 3 may be applied as, for example, the clock transmitter 411 and the data transmitter 413, and the receiving devices 220 and 320 shown in FIGS. 2 and 3 may be applied as, the clock receiver 422, the clock generation circuit 431 and the data receiver 424. Also, the transmission devices 210 and 310 and the receiving devices 220 and 320 shown in FIGS. 2 and 3 may be applied as the data input/output circuit 432 and the data transmitter 423, and may be applied as the data receiver 424 and the data input/output circuit 432.

FIG. 5 is a diagram illustrating a representation of an example of the configuration of a semiconductor apparatus 5 in accordance with an embodiment. FIG. 5 illustrates a case where a transmission device and a receiving device are respectively applied as the data input/output circuit 432 and the data transmitter 423 shown in FIG. 4. In FIG. 5, the semiconductor apparatus 5 may include an output enable signal generation circuit 510 and a plurality of data output drivers 521, 522 and 523. The output enable signal generation circuit 510 may function as a transmission device, and the plurality of data output drivers 521, 522 and 523 may function as a receiving device. The output enable signal generation circuit 510 may generate a plurality of output enable signals OE<1:m> based on an internal clock signal INCLK, a command signal CMD and a latency LAT. The command signal CMD as a signal which instructs the second semiconductor apparatus 420 to output data DQ may be, for example, a read signal. The latency LAT may be an information which defines a time from when the second semiconductor apparatus 420 receives the command CMD to when the second semiconductor apparatus 420 actually outputs data DQ, and a latency 1 may be a time corresponding to one cycle of the clock signal CLK. The output enable signal generation circuit 510 may sequentially enable the plurality of output enable signals OE<1:m> based on the internal clock signal INCLK after the command signal CMD is received and a time corresponding to the latency LAT elapses. For example, the output enable signal generation circuit 510 may sequentially enable the plurality of output enable signals OE<1:m> from a point of time corresponding to LAT-5. The output enable signal generation circuit 510 may sequentially transmit the plurality of output enable signals OE<1:m> in synchronization with the internal clock signal INCLK.

The plurality of data output drivers 521, 522 and 523 may be coupled with the output enable signal generation circuit 510 through a first signal transmission line 501, and may receive the output enable signals OE<1:m>. Further, the plurality of data output drivers 521, 522 and 523 may receive the internal clock signal INCLK through a second signal transmission line 502. The plurality of data output drivers 521, 522 and 523 may receive internal data D1, D2 and D3 respectively allocated thereto, and may output the internal data D1, D2 and D3 as the data DQ based on the output enable signals OE<1:m> received through the first signal transmission line 501. The plurality of data output drivers 521, 522 and 523 may receive the output enable signals OE<1:m> in synchronization with the internal clock signal INCLK. The semiconductor apparatus 5 may operate by defining a latency having different values depending on an operating frequency. For example, the value of the latency LAT may be increased when the semiconductor apparatus 5 operates with a high frequency, and may be decreased when the semiconductor apparatus 5 operates with a low frequency. For example, when the semiconductor apparatus 5 operates with a low frequency, the latency LAT may be equal to or less than 10, the output enable signal generation circuit 510 may transmit the output enable signals OE<1:m> from a point of time corresponding to LAT-5, and the data output drivers 521, 522 and 523 may complete receiving of the output enable signals OE<1:m> at a point of time corresponding to LAT-2. When the semiconductor apparatus 5 operates with a high frequency, the latency LAT may be greater than 10. In this case, the output enable signal generation circuit 510 may transmit the output enable signals OE<1:m> from a point of time corresponding to LAT-7. The output enable signals OE<1:m> may be outputted two cycles of the internal clock signal INCLK earlier than when the semiconductor apparatus 5 operates with a low frequency, and the data output drivers 521, 522 and 523 may compensate for a delay time induced by the mismatch or the offset between the first and second signal transmission lines 501 and 502 within two cycles of the internal clock signal INCLK. The data output drivers 521, 522 and 523 may compensate for the delay time and may complete receiving of the output enable signals OE<1:m> at a point of time corresponding to LAT-2.

While various embodiments have been described above, it will be understood to those skilled in the art that the embodiments described are examples only. Accordingly, the semiconductor apparatus for transmitting and receiving a

What is claimed is:

1. A semiconductor apparatus comprising:
a transmission device configured to output a transmission signal as an output signal in synchronization with a clock signal, and output the output signal at one of a first time and a second time, the second time being earlier than the first time, based on an operation information signal, wherein a difference between the second time and the first time is n (n is integer of 1 or more) times one cycle of the clock signal; and
a receiving device configured to receive the output signal and the clock signal and generate a reception signal by delaying the output signal by a time corresponding to one of a third time and a fourth time, the fourth time being later than the third time, based on the operation information signal.

2. The semiconductor apparatus according to claim 1, wherein a first signal transmission line is configured to transmit the output signal,
wherein a second signal transmission line is configured to transmit the clock signal, and
wherein a time difference between the fourth time and the third time is a time that is obtained by subtracting a delay time induced in the first signal transmission line and a delay time induced in the second signal transmission line, from the time difference between the second time and the first time.

3. A semiconductor apparatus comprising:
a transmission device configured to generate an output signal from a transmission signal in synchronization with a clock signal; and
a receiving device configured to receive the output signal and the clock signal, generate a delayed output signal by delaying the output signal in synchronization with a delayed clock signal generated by delaying the clock signal, and generate a reception signal by selectively synchronizing one of the output signal and the delayed output signal with the clock signal.

4. The semiconductor apparatus according to claim 3, wherein the transmission device generates a delayed transmission signal by delaying the transmission signal by a time corresponding to n (n is an integer of 1 or more) times one cycle of the clock signal, generates the output signal from the transmission signal when the semiconductor apparatus operates with a high frequency, and generates the output signal from the delayed transmission signal when the semiconductor apparatus operates with a low frequency lower than the high frequency.

5. The semiconductor apparatus according to claim 3, wherein the transmission device comprises:
a transmission delay circuit configured to generate a delayed transmission signal by delaying the transmission signal by a time corresponding to n (n is an integer of 1 or more) times one cycle of the clock signal;
a transmission selection circuit configured to output one of the transmission signal and the delayed transmission signal based on an operation information signal which is associated with an operating speed of the semiconductor apparatus; and
a synchronized transmission circuit configured to generate the output signal from an output of the transmission selection circuit in synchronization with the clock signal.

6. The semiconductor apparatus according to claim 5, wherein the transmission delay circuit comprises at least one flip-flop which generates the delayed transmission signal by delaying the transmission signal in synchronization with the clock signal.

7. The semiconductor apparatus according to claim 3,
wherein a first signal transmission line configured to transmit the output signal,
wherein a second signal transmission line configured to transmit the clock signal, and
wherein the delayed clock signal is generated by delaying the clock signal by a preset time corresponding to a difference between a delay time induced in the first signal transmission line and a delay time induced in the second signal transmission line.

8. The semiconductor apparatus according to claim 3, wherein the receiving device comprises:
a timing compensation circuit configured to generate a delayed clock signal by delaying the clock signal by the preset time;
a receiving delay circuit configured to generate a delayed output signal from the output signal in synchronization with the delayed clock signal;
a receiving selection circuit configured to output one of the output signal and the delayed output signal based on an operation information signal which is associated with an operating speed of the semiconductor apparatus; and
a synchronized receiving circuit configured to generate the reception signal from an output of the receiving selection circuit in synchronization with the clock signal.

9. The semiconductor apparatus according to claim 8, wherein the receiving delay circuit comprises at least one flip-flop which generates the delayed output signal by delaying the output signal in synchronization with the delayed clock signal.

10. A semiconductor apparatus comprising:
a transmission device configured to transmit an output signal in correspondence to a clock signal, transmit the output signal at a first time when the semiconductor apparatus operates with a low frequency, and transmit the output signal at a second time, the second time being earlier than the first time, when the semiconductor apparatus operates with a high frequency, the high frequency being greater than the low frequency; and
a receiving device configured to receive the clock signal and the output signal, generate a reception signal by synchronizing the output signal with the clock signal when the semiconductor apparatus operates with a low frequency, and generate the reception signal by synchronizing the output signal with a delayed clock signal generated, by delaying the clock signal by a preset time, when the semiconductor apparatus operates with a high frequency.

11. The semiconductor apparatus according to claim 10, wherein a time difference between the second time and the first time is n (n is an integer of 1 or more) times one cycle of the clock signal.

12. The semiconductor apparatus according to claim 10, wherein the transmission device comprises:
a transmission delay circuit configured to generate a delayed transmission signal by delaying the transmission signal by a time corresponding to n (n is an integer of 1 or more) times one cycle of the clock signal;
a transmission selection circuit configured to output one of the transmission signal and the delayed transmission signal based on an operation information signal which is associated with an operating speed of the semiconductor apparatus; and a synchronized transmission circuit configured to generate the output signal from an output of the transmission selection circuit in synchronization with the clock signal.

13. The semiconductor apparatus according to claim 12, wherein the transmission delay circuit comprises at least one flip-flop which generates the delayed transmission signal by delaying the transmission signal in synchronization with the clock signal.

14. The semiconductor apparatus according to claim 10, wherein the receiving device comprises:

a timing compensation circuit configured to generate a delayed clock signal by delaying the clock signal by a preset time;

a receiving delay circuit configured to generate a delayed output signal from the output signal in synchronization with the delayed clock signal;

a receiving selection circuit configured to output one of the output signal and the delayed output signal based on an operation information signal which is associated with an operating speed of the semiconductor apparatus; and a synchronized receiving circuit configured to generate the reception signal from an output of the receiving selection circuit in synchronization with the clock signal.

15. The semiconductor apparatus according to claim 14, wherein the receiving delay circuit comprises at least one flip-flop which generates the delayed output signal by delaying the output signal in synchronization with the delayed clock signal.

16. The semiconductor apparatus according to claim 14, further comprising:

a first signal transmission line configured to transmit the output signal; and a second signal transmission line configured to transmit the clock signal, wherein the preset time is equal to or longer than a difference between a delay time induced in the first signal transmission line and a delay time induced in the second signal transmission line.

17. A semiconductor apparatus comprising:

a transmission device configured to delay a transmission signal in synchronization with a clock signal to generate a delayed transmission signal, and generate an output signal by selectively synchronizing one of the transmission signal and the delayed transmission signal with the clock signal; and a receiving device configured to receive the output signal and the clock signal, and generate a reception signal from the output signal in synchronization with the clock signal and a delayed clock signal which is generated by delaying the clock signal.

18. The semiconductor apparatus according to claim 17, wherein the transmission device generates the output signal from one of the transmission signal and the delayed transmission signal in synchronization with the clock signal based on an operation information signal.

19. The semiconductor apparatus according to claim 17, wherein the receiving device delays the output signal in synchronization with the delayed clock signal to generate a delayed output signal, and generate the reception signal by synchronizing one of the output signal and the delayed output signal with the clock signal based on an operation information signal.

* * * * *